United States Patent
Ting et al.

(10) Patent No.: US 10,437,567 B2
(45) Date of Patent: Oct. 8, 2019

(54) SYSTEM AND METHOD FOR USE IN PHYSICAL DESIGN PROCESSES

(71) Applicant: Cadence Design Systems, Inc., San Jose, CA (US)

(72) Inventors: Li-Chien Ting, Mountain View, CA (US); Shelly Ann Evans, Los Gatos, CA (US); Serena Chiang Caluya, Pleasanton, CA (US); Alexey Nikolaevich Peskov, Moscow (RU); Pavel Nikolaevich Migachev, Moscow (RU); Alexander Smirnov, Moscow (RU); Oleg Kostyuchenko, Moscow (RU); David Y. Yang, San Jose, CA (US); Roman Vladimirovich Rybalkin, Moscow (RU)

(73) Assignee: Cadence Design Systems, Inc., San Jose, CA (US)

( * ) Notice: Subject to any disclaimer, the term of this patent is extended or adjusted under 35 U.S.C. 154(b) by 127 days.

(21) Appl. No.: 15/550,281

(22) PCT Filed: Nov. 29, 2016

(86) PCT No.: PCT/US2016/063985
§ 371 (c)(1),
(2) Date: Aug. 10, 2017

(87) PCT Pub. No.: WO2018/101911
PCT Pub. Date: Jun. 7, 2018

(65) Prior Publication Data
US 2018/0336017 A1  Nov. 22, 2018

(51) Int. Cl.
*G06F 9/44* (2018.01)
*G06F 8/34* (2018.01)
(Continued)

(52) U.S. Cl.
CPC ............... *G06F 8/34* (2013.01); *G06F 8/33* (2013.01); *G06F 17/5045* (2013.01); *G01R 31/318371* (2013.01)

(58) Field of Classification Search
CPC ...................................................... G06F 8/34
See application file for complete search history.

(56) References Cited

U.S. PATENT DOCUMENTS

| | | |
|---|---|---|
| 5,604,895 A | 2/1997 | Raimi |
| 6,219,802 B1 * | 4/2001 | Beeker ............... G06F 11/3684 707/999.006 |

(Continued)

OTHER PUBLICATIONS

International Search Report and Written Opinion issued in related International Application No. PCT/US2016/063985 dated Feb. 6, 2017.

*Primary Examiner* — Hang Pan
(74) *Attorney, Agent, or Firm* — Mark H. Whittenberger, Esq.; Holland & Knight LLP

(57) ABSTRACT

The present disclosure relates to a computer-implemented method for use in an electronic design environment. Embodiments may include defining, using at least one processor, a grammar object system including one or more of objects, elements, values and relationships. Embodiments may include generating a technology grammar binary representation, based upon, at least in part, the grammar object system and receiving a technology ASCII representation. Embodiments may further include parsing at least one of the technology grammar binary representation and the technology ASCII representation to generate a technology binary representation and providing the technology binary representation to at least one of a graphical user interface or a database.

14 Claims, 14 Drawing Sheets

(51) Int. Cl.
    *G06F 8/33*          (2018.01)
    *G06F 17/50*       (2006.01)
    *G01R 31/3183*   (2006.01)

(56) References Cited

U.S. PATENT DOCUMENTS

| | | | |
|---|---|---|---|
| 6,529,909 B1 | | 3/2003 | Bowman-Amuah |
| 7,162,703 B1 | * | 1/2007 | Aik ................... G06F 17/5081 |
| | | | 716/106 |
| 2002/0007483 A1 | | 1/2002 | Lopez |
| 2003/0046317 A1 | * | 3/2003 | Cseri .................. G06F 17/218 |
| | | | 715/234 |
| 2007/0260571 A1 | * | 11/2007 | Mansfield ............ G06F 17/227 |
| | | | 706/48 |
| 2012/0280927 A1 | | 11/2012 | Ludwig |
| 2014/0310320 A1 | * | 10/2014 | Chen .................. G06F 17/2264 |
| | | | 707/809 |

* cited by examiner

SYSTEM AND METHOD FOR USE IN PHYSICAL DESIGN PROCESSES

RELATED APPLICATIONS

The subject application is a U.S. National Stage Application of International Application No. PCT/US2016/063985, filed on Nov. 29, 2016, the contents of which are herein incorporated by reference in its entirety.

FIELD OF THE INVENTION

The present disclosure relates to electronic design automation, and more specifically, to a system and method for use in physical design processes

DISCUSSION OF THE RELATED ART

Electronic design automation (EDA) utilizes software tools that may be used in the design and analysis of numerous electronic systems such as printed circuit boards (PCBs) and integrated circuits (ICs). Existing systems do not have an effective method to create and edit a process technology file. The only available editing method available is through a text editor that forces the user to enter the process information correctly and the information can only be verified by loading the file into an EDA application. Moreover, existing systems do not have a method to describe the structure of process technology information. For example, when new technology rules need to be added due to new foundry requirements, their specifications are created manually while trying to maintain consistency with the format of the existing technology rules. The result of such rule specifications can result in significant development time.

SUMMARY

In one or more embodiments of the present disclosure, a computer-implemented method for use in an electronic design environment is provided. The method may include defining, using at least one processor, a grammar object system including one or more objects, elements, values and relationships. The method may include generating a technology grammar binary representation, based upon, at least in part, the grammar object system and receiving a technology ASCII representation. The method may further include parsing at least one of the technology grammar binary representation and the technology ASCII representation to generate a technology binary representation and providing the technology binary representation to at least one of a graphical user interface or a database.

One or more of the following features may be included. In some embodiments, the method may include providing the technology binary representation to a technology rule documentation module. In some embodiments, the grammar object system may be expressed in extensible markup language ("XML"). The method may further include automatically generating C++ code based upon, at least in part, the XML expression. In some embodiments, the graphical user interface may be configured to display a dialog based upon, at least in part, a rule associated with a text editor. The graphical user interface may be configured to allow for the display or editing of at least one technology rule. The graphical user interface may include at least one of a text editor and a rule editor.

In some embodiments, a computer-readable storage medium having stored thereon instructions that when executed by a machine result in one or more operations is provided. Operations may include defining, using at least one processor, a grammar object system including one or more objects, elements, values and relationships. Operations may include generating a technology grammar binary representation, based upon, at least in part, the grammar object system and receiving a technology ASCII representation. Operations may further include parsing at least one of the technology grammar binary representation and the technology ASCII representation to generate a technology binary representation and providing the technology binary representation to at least one of a graphical user interface or a database.

One or more of the following features may be included. In some embodiments, the method may include providing the technology binary representation to a technology rule documentation module. In some embodiments, the grammar object system may be expressed in extensible markup language ("XML"). Operations may further include automatically generating C++ code based upon, at least in part, the XML expression. In some embodiments, the graphical user interface may be configured to display a dialog based upon, at least in part, a rule associated with a text editor. The graphical user interface may be configured to allow for the display or editing of at least one technology rule. The graphical user interface may include at least one of a text editor and a rule editor.

In one or more embodiments of the present disclosure, a system for use in an electronic design environment is provided. The system may include at least one processor configured to define a grammar object system including one or more objects, elements, values and relationships. The at least one processor may be further configured to generate a technology grammar binary representation, based upon, at least in part, the grammar object system. The at least one processor may be further configured to receive a technology ASCII representation and parse at least one of the technology grammar binary representation and the technology ASCII representation to generate a technology binary representation. The at least one processor may be further configured to provide the technology binary representation to at least one of a graphical user interface or a database.

One or more of the following features may be included. In some embodiments, the at least one processor may be further configured to provide the technology binary representation to a technology rule documentation module. In some embodiments, the grammar object system may be expressed in extensible markup language ("XML"). The at least one processor may be further configured to automatically generate C++ code based upon, at least in part, the XML expression. The graphical user interface may be configured to display a dialog based upon, at least in part, a rule associated with a text editor. The graphical user interface may be configured to allow for the display or editing of at least one technology rule.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 7 is a diagram depicting aspects of the design process in accordance with an embodiment of the present disclosure;

FIG. 8 is a diagram depicting aspects of the design process in accordance with an embodiment of the present disclosure;

FIG. 10 is a diagram depicting aspects of the design process in accordance with an embodiment of the present disclosure;

FIG. 11 is a diagram depicting aspects of the design process in accordance with an embodiment of the present disclosure;

FIG. 12 is a diagram depicting aspects of the design process in accordance with an embodiment of the present disclosure;

FIG. 13 is a diagram depicting aspects of the design process in accordance with an embodiment of the present disclosure; and FIG. 14 is a diagram depicting aspects of the design process in accordance with an embodiment of the present disclosure.

DETAILED DESCRIPTION

Figure 1:
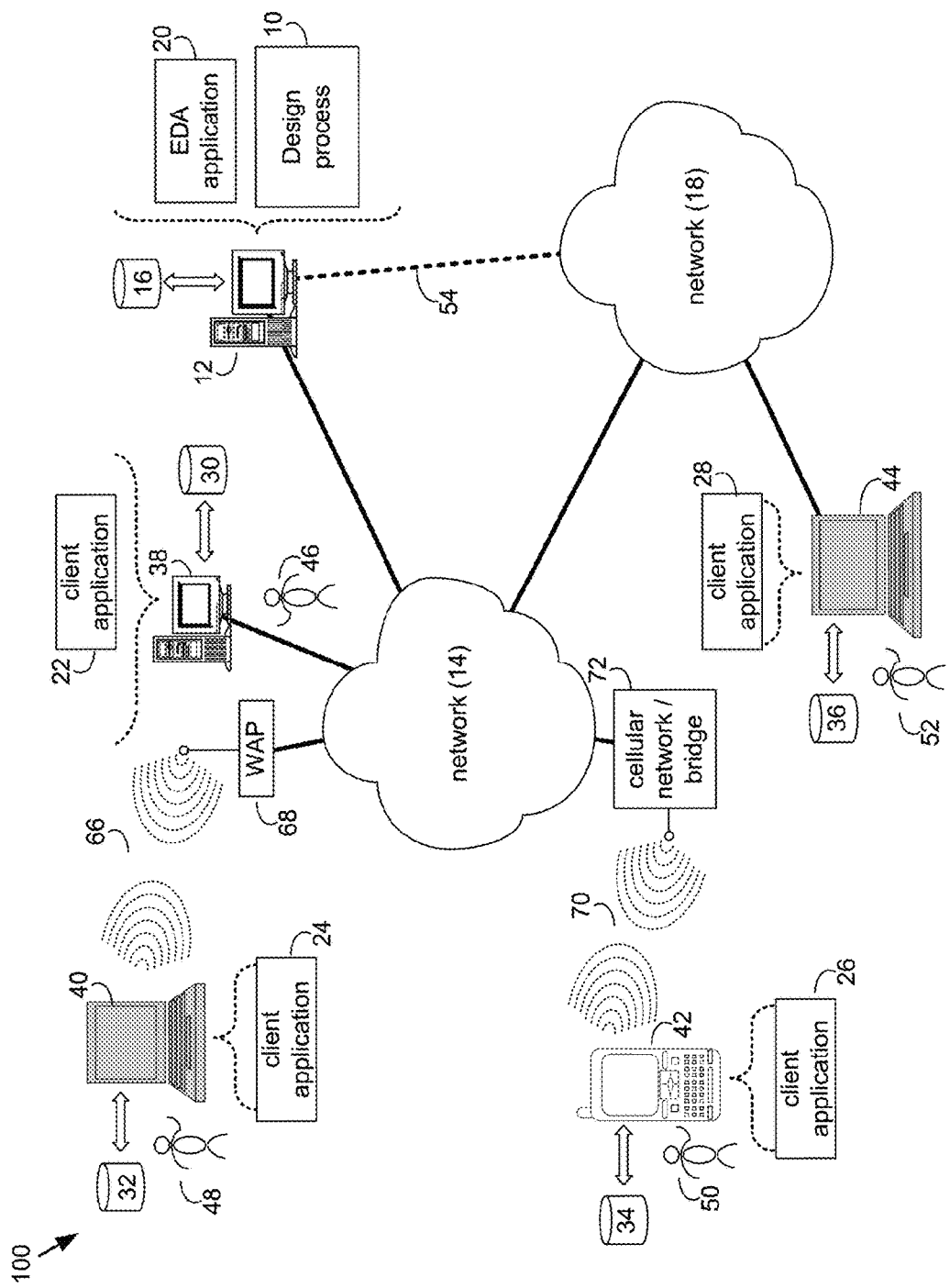
FIG. 1 is a system diagram depicting aspects of the design process in accordance with an embodiment of the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, $C^{++}$ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, a number of processes that may reside on and may be executed by server computer 12, which may be connected to network 14 (e.g., the Internet or a local area network) are provided. Embodiments of the present disclosure are directed towards a design process 10, which is discussed in further detail hereinbelow. Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the processes described herein may reside on and be executed, in whole or in part, by a client electronic device, such as a personal computer, notebook computer, personal digital assistant, or the like.

The instruction sets and subroutines of design process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Design process 10 may be a stand alone application, or may be an applet/application/script that may interact with and/or be executed within EDA application 20. In addition/as an alternative to being a server-side process, design process 10 may be a client-side process (not shown) that may reside on a client electronic device (described below) and may interact with an EDA client application (e.g., one or more of EDA client applications 22, 24, 26, 28). Further, the design process 10 may be a hybrid server-side/client-side process that may interact with EDA application 20 and an EDA client application (e.g., one or more of client applications 22, 24, 26, 28). As such, design process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize design process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
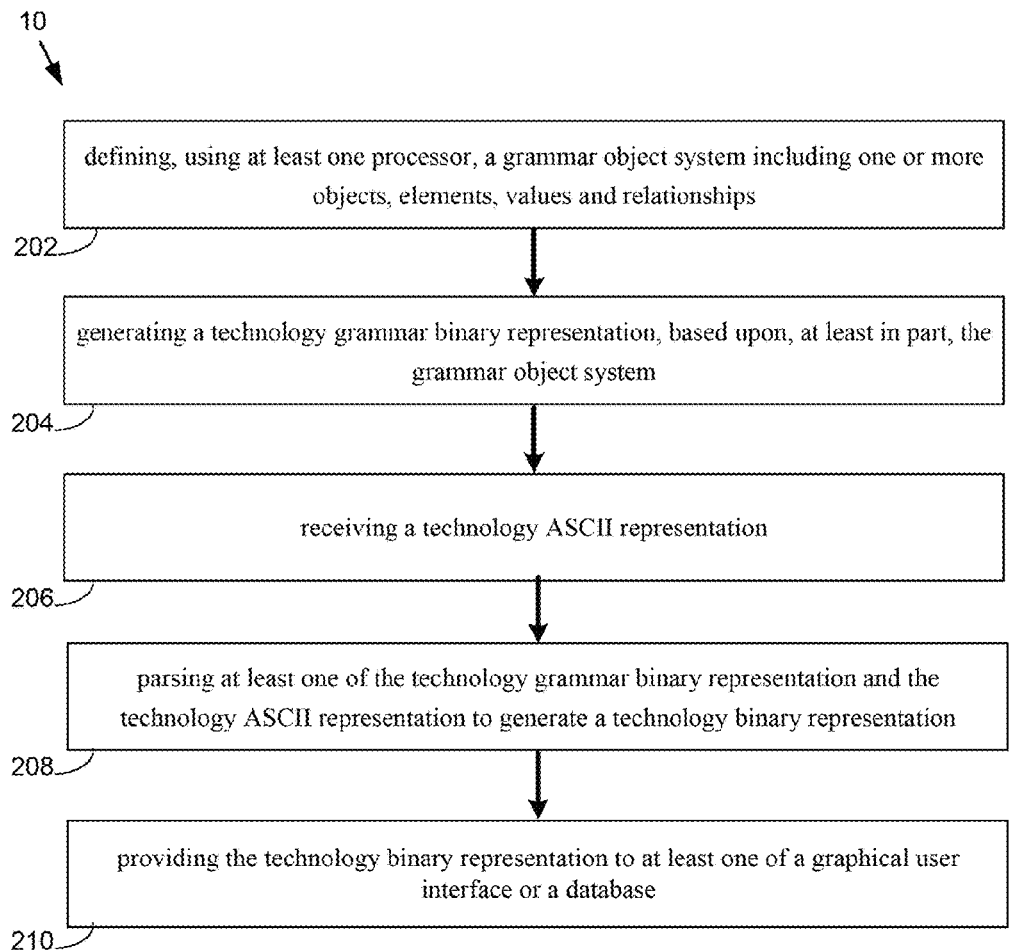
FIG. 2 is a flowchart depicting operations consistent with the design process of the present disclosure.

Referring now to FIG. 2, an embodiment of design process 10 is provided. The method may include defining (202), using at least one processor, a grammar object system including one or more of objects, elements, values and relationships. Embodiments may include generating (204) a technology grammar binary representation, based upon, at least in part, the grammar object system and receiving (206) a technology ASCII representation. Embodiments may further include parsing (208) at least one of the technology grammar binary representation and the technology ASCII representation to generate a technology binary representation and providing (210) the technology binary representation to at least one of a graphical user interface or a database.

As used herein, the phrase "technology grammar" may refer to the description of a technology rule's syntax and semantic definition. The phrase "binary representation" may denote such information is captured in a computer readable format (e.g., not human readable). The syntax and semantic may be built upon the objects, elements, values and relationships.

As used herein, the phrase "technology ASCII representation" may refer to a text file (e.g., ASCII file, etc.) containing technology rules written following the technology grammar.

As used herein, the phrase "technology binary representation" may refer to the output of parsing the "technology ASCII representation" using the "technology grammar binary representation" as a guide.

In some embodiments, EDA application 20 and/or design process 10 may support a variety of languages and/or standards. EDA application 20 may support one or more software extensions and may be used in conjunction with one or more EDA tools such as those available from the Assignee of the subject application.

Embodiments of design process 10 may provide an integrated design environment for use with advanced physical design process technology. As discussed above, existing systems do not have an effective method to create and edit a process technology file. The only available editing method available is through a text editor that forces the user to enter the process information correctly and the information can only be verified by loading the file into a corresponding EDA application. As process technology advances to lower process nodes, process rules are being defined by more parameters that can have different relationships (e.g., group, exclusive, dependent) between them. The parameter values may also be expressed by complex representations such as ranges and tables. It is burdensome for the user to remember and maintain the correct syntax for these complex rules and values. Accordingly, embodiments of design process 10 may be configured to utilize an object system that defines the technology rule and offers a smart editing environment where each rules syntax structure may be maintained and enforced by this environment. Under existing systems all editing to the process technology file can only be done through a text editor (e.g., vi, emacs, etc.). As such, the user is left with the burden to create and edit the process technology file by hand with the basic text editors, and verify the technology process file in a manual and iterative manner.

Based on usability studies, editing complex information through a GUI-based environment has a higher usability value. The primary cause of the problem is the problem itself is unbounded. The rapid rate of new process technology rules that are increasingly complex presents a significant challenge for GUI development. The effort to develop a GUI manually for each rule is not a scalable proposition for a commercial application.

Figure 3:
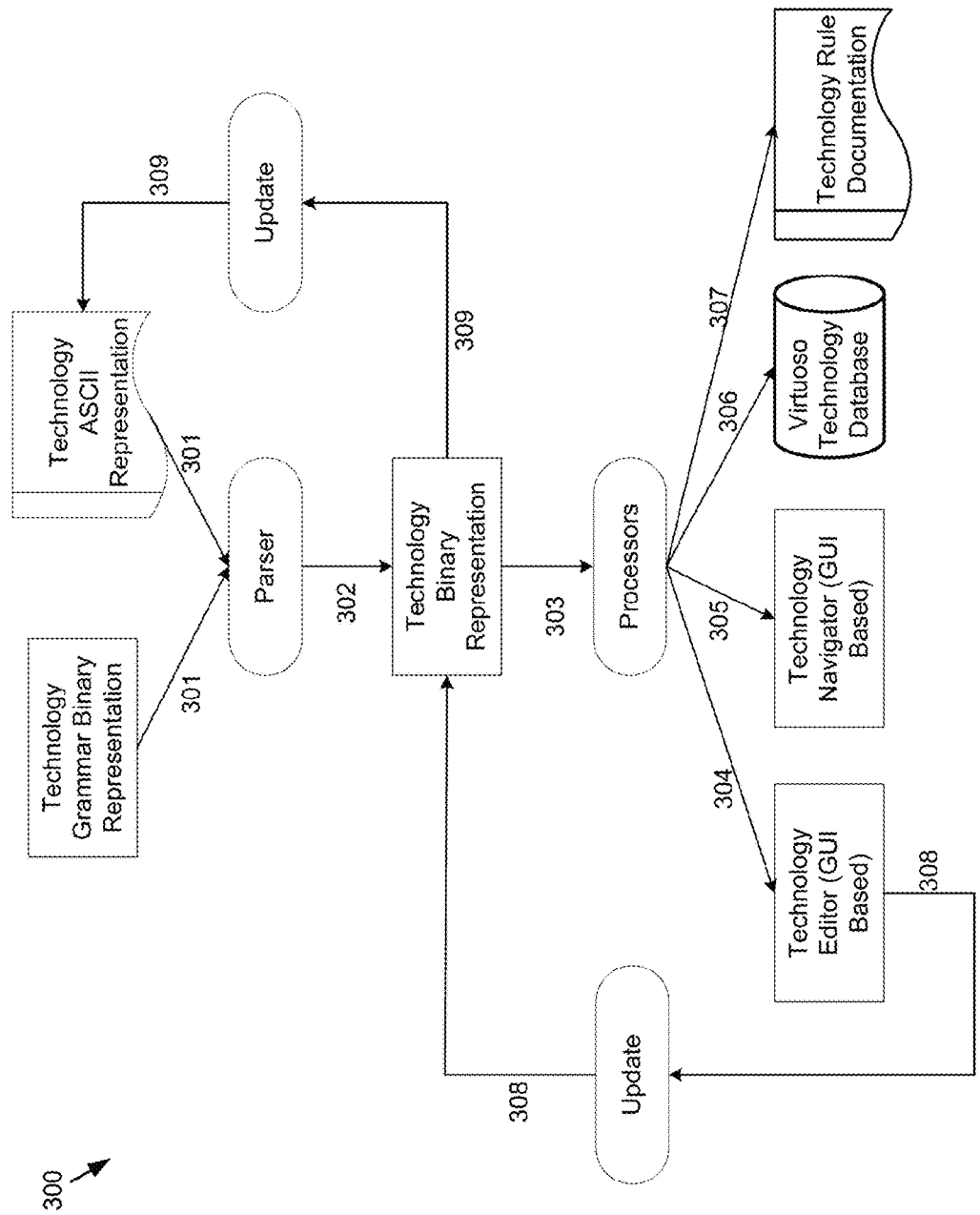
FIG. 3 is a diagram depicting aspects of the design process in accordance with an embodiment of the present disclosure.

Referring now to FIG. 3, an embodiment of design process 10 representing an example user flow is provided. In some embodiments, the parser may be configured to receive the technology grammar binary representation and technology ASCII representation 301. The parser may then generate a technology binary representation 302. In some embodiments, the parser may be included as part of the an EDA technology object system. Accordingly, design process 10 may provide for the creation of a parser that may be configured to analyze the input technology rule file based on the available grammar object system. This parser may be configured to parse any technology rules that have their grammar defined in the grammar object system.

In some embodiments, the binary data may be processed by various processors 303 in order to provide the user with the ability to edit the technology rule information in a GUI based environment 304. Additionally and/or alternatively, design process 10 may allow the user to navigate the often lengthy technology rule file rapidly 305, create a technology database stored in a database (e.g., OpenAccess, etc.) for future design uses 306, and/or generate documentation for each technology rule 307. The technology binary representation may be updated after user made edits through the technology editor 308, and this update may be propagated to the technology ASCII representation 309.

In some embodiments, a GUI based representation, as provided herein, may eliminate the need for the user to remember the syntax or even the semantics of a process technology rule. The information may be presented in an intuitive style where relationships between rule parameters are conveyed by GUI widgets' behavior. The editing environment may be configured to update the original process technology file with the accurate syntax. The GUI based representation may be created on demand and may be based on the process technology rule selected by the user. This is possible because all relevant rule information (e.g., syntax, semantic and actual values) may be available in the technology binary representation. The appropriate processor algorithm may create the GUI representation based on these information.

In contrast, and as discussed above, the current conventional implementation is to edit the process technology rule using a primitive text editor that has no support for a rule's syntax, semantic or relationship information. Embodiments of design process 10 may enable the user to focus on applying the rules to define the technology process instead of struggling with a rule's syntax structure. Accordingly, embodiments of design process 10 may allow new process technology rules to be incorporated into the GUI based application very rapidly, ensure the rules are free from syntax and semantic violations, and improve the accessibility and readability when viewing a process technology file.

Embodiments of design process may also provide an object system for describing physical design process technology. Existing systems do not have a method to describe the structure of process technology information. When new technology rules need to be added due to new foundry requirements, their specifications are created manually while trying to maintain consistency with the format of existing technology rules. The result of such rule specifications can result in significant development time. Embodiments of design process 10 may provide a well-defined object based specification system where all existing and new rules may be described by it. Under this object system, a well-defined infrastructure may exist to facilitate authoring of the parser with minimum manual editing effort and may provide a run-time environment with access to both the rule definitions and instances of these rules. Existing systems provide an ASCII file for the user to specify the desired technology information. Each technology rule has its own syntax structure following undocumented conventions on how information should be described. However, in these systems, the current technology ASCII file format cannot be changed as many customers are relying on its current format. The parser for this ASCII file may need to be enhanced for each new technology rule in a manual effort. Moreover, the number of new technology rules is increasing at a very rapid pace as process technology advances to 10 nm, 7 nm, 5 nm and beyond. It is a resource challenge as well as a quality challenge to produce an accurate parser to meet customer's schedule demand. Furthermore, the advanced technology rules no longer use a single value to represent the constraint setting. A constraint value may now depend on two or more parameter values to determine the actual value via a table lookup. The current table value representation, as lists of indices and value in a textual format, is not intuitive for EDA application users to read and edit, and it is easy to introduce errors. One issue is the lack of a formal specification for the EDA application process technology, which may force a user to interact directly with this unstructured ASCII file without assistance.

Figure 4:
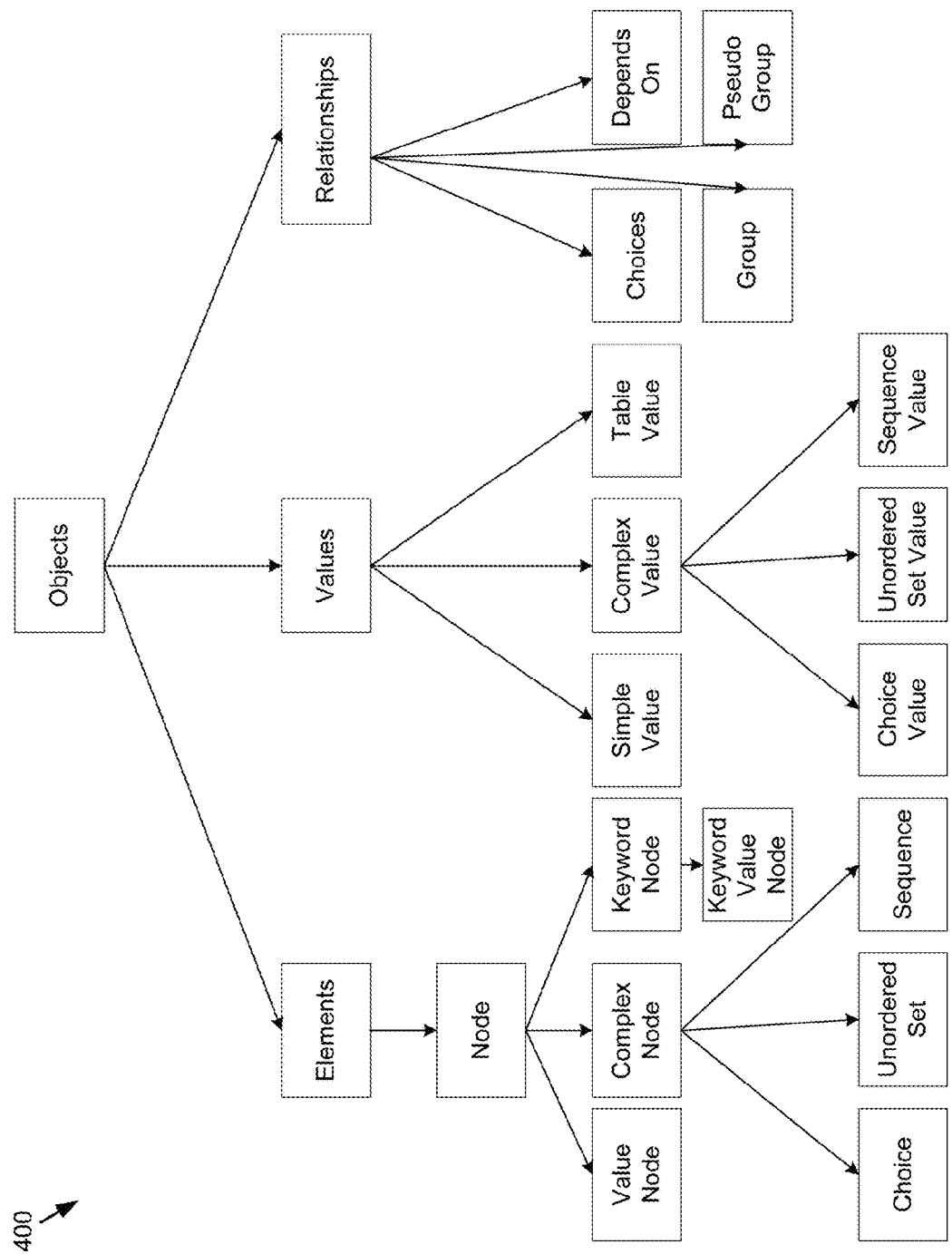
FIG. 4 is a diagram depicting aspects of the design process in accordance with an embodiment of the present disclosure.

Referring now to FIG. 4, an example of a grammar technology object system associated with design process 10 is provided. In this particular diagram the class hierarchy of the object system for a grammar definition is shown. Accordingly, all technology rules syntax and semantics may be represented by this object system. In some embodiments, the "Element" branch may be used to represent a rule's structure that allows required (e.g., sequential and ordered), optional (e.g., not ordered) and choices to be defined. The "Values" branch may be used to represent a rule element's value that can take on different representations such as a simple value, a table value, a value from a set of choices, a value formed by a set of ordered and/or not ordered values. The "Relationship" branch may be used to capture semantic information such as dependence, grouping and choices. In some embodiments, the pseudo group may provide a short cut to simplify relationship representation.

As shown in FIG. 4, embodiments of design process 10 may be configured to provide a definition of a grammar object system. In some embodiments, this may be used to represent the grammar for constructing technology rules. The grammars may be expressed using any suitable approach, in extensible markup language ("XML") for example, and this XML may be used to automatically generate the code (e.g., $C^{++}$) for the implementation of this grammar object system. Any reference to specific languages is provided merely by way of example as the teachings of the present disclosure is not intended to be limited to these examples.

Figure 5:
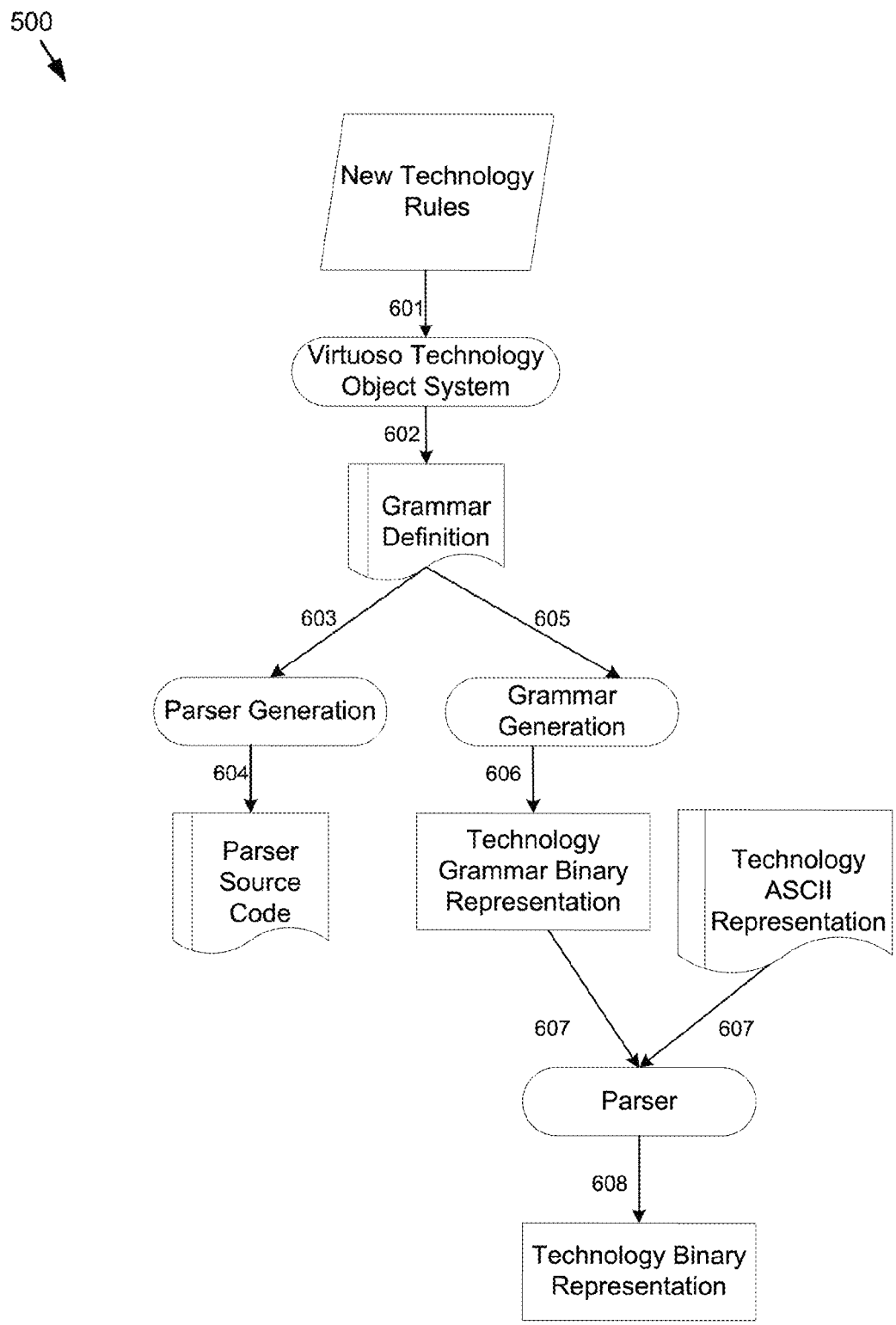
FIG. 5 is a diagram depicting aspects of the design process in accordance with an embodiment of the present disclosure.

Referring now to FIG. 5, an example of a technology rule flow associated with design process 10 is provided. In this particular embodiment an exemplary flow for supporting technology rules within an EDA platform is shown. The rule may be created by using the technology object system 501 and may produce a textual grammar definition file 502. In some embodiments the grammar definition file may be provided to a parser generation process 503, which may be configured to automatically produce the parser source code (e.g., in $C^{++}$) 504 that may be linked into the EDA application. The grammar definition file may be provided to a grammar generation process 505 to produce the binary representation of the grammar definition 506 that may be used within the EDA application. For example, the parser may read the ASCII file 507 and generate the technology binary representation 508.

Accordingly, embodiments of design process 10 may utilize a formal declaration system. This system may be configured to provide the building blocks to describe a process technology rule's syntax and semantics. It has the ability to describe syntax branches via choices or relationships. This system also supports the different value structures.

In some embodiments, once one or more new rules' grammars are defined and created within the technology object system, the EDA system may be updated with the new parser source code. The parser generation capability greatly simplifies development effort as new process technology rules are introduced. This may be possible when the rules are based on the object system that provides the rules on how to analyze the strings representing the rules. The grammar generation capability may be configured to make all grammar definition information available in a run-time environment where new application capability can be developed.

Existing approaches primarily focus on syntax for a specific data representation where the syntax is expressed only in a documentation. This style of syntax definition allows anyone to develop a reader or a parser to process the file, but lacks standardization on how the information read in is represented. Embodiments of the present disclosure may formalize both the grammar definition as well as the parsed representation. This foundation layer allowed additional tasks to be automated. Additionally and/or alternatively, embodiments of the present disclosure may provide a formal specification of the process technology rules that may be accessible in application software while also providing a method to generate the rule's parser code automatically. Embodiments of the present disclosure may also provide a method to store and access parsed rule information in application software.

Figure 6:
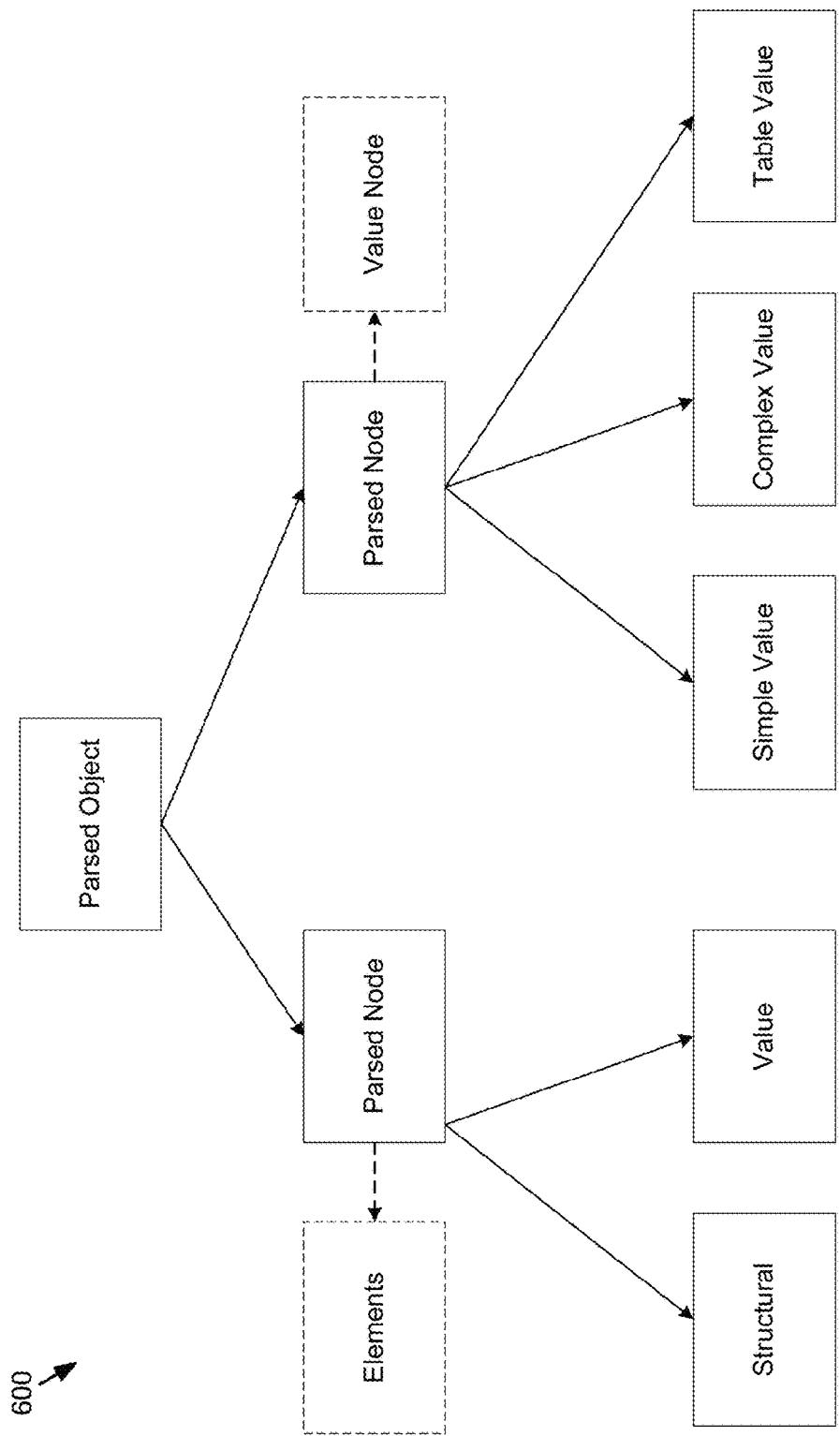
FIG. 6 is a diagram depicting aspects of the design process in accordance with an embodiment of the present disclosure.

Referring now to FIG. 6, an example of a parsed object system according to an embodiment of design process 10 is provided. This example provides a definition for how an actual technology rule may be represented after the rule is parsed. In some embodiments this may be based on the definition for this rule in the grammar object system. In this particular embodiment the class hierarchy of the object system for parsed results is shown. All contents from a process technology file may be represented through this object system. In some embodiments, the parsed node may include a reference to the corresponding element instance from the grammar class hierarchy.

Referring now to FIGS. 7-17, embodiments depicting various graphical user interfaces that may be used in accordance with design process 10 are provided. Design process 10 may be configured to enable a graphical user interface (GUI) system where a dialog may be created dynamically based on the rule selected in the text editor. This design approach may enable the support of a new technology rule by just defining its grammar.

In some embodiments, the editing environment included herein may be configured to allow technology rules to be viewed and edited in an intuitive environment. Some features may include, but are not limited to, a navigator to provide fast access for viewing of different pieces of a technology rule file, a text editor for viewing and editing the technology rules, a rule editor for viewing and editing the technology rules, the ability to cross highlight between the rule text and its corresponding GUI widget, and the ability for changes made in a particular GUI to be reflected automatically in the textual view. In this way, the user no longer needs to be concern about the grammar syntax. This may be relevant for table values, etc.

Figure 7:
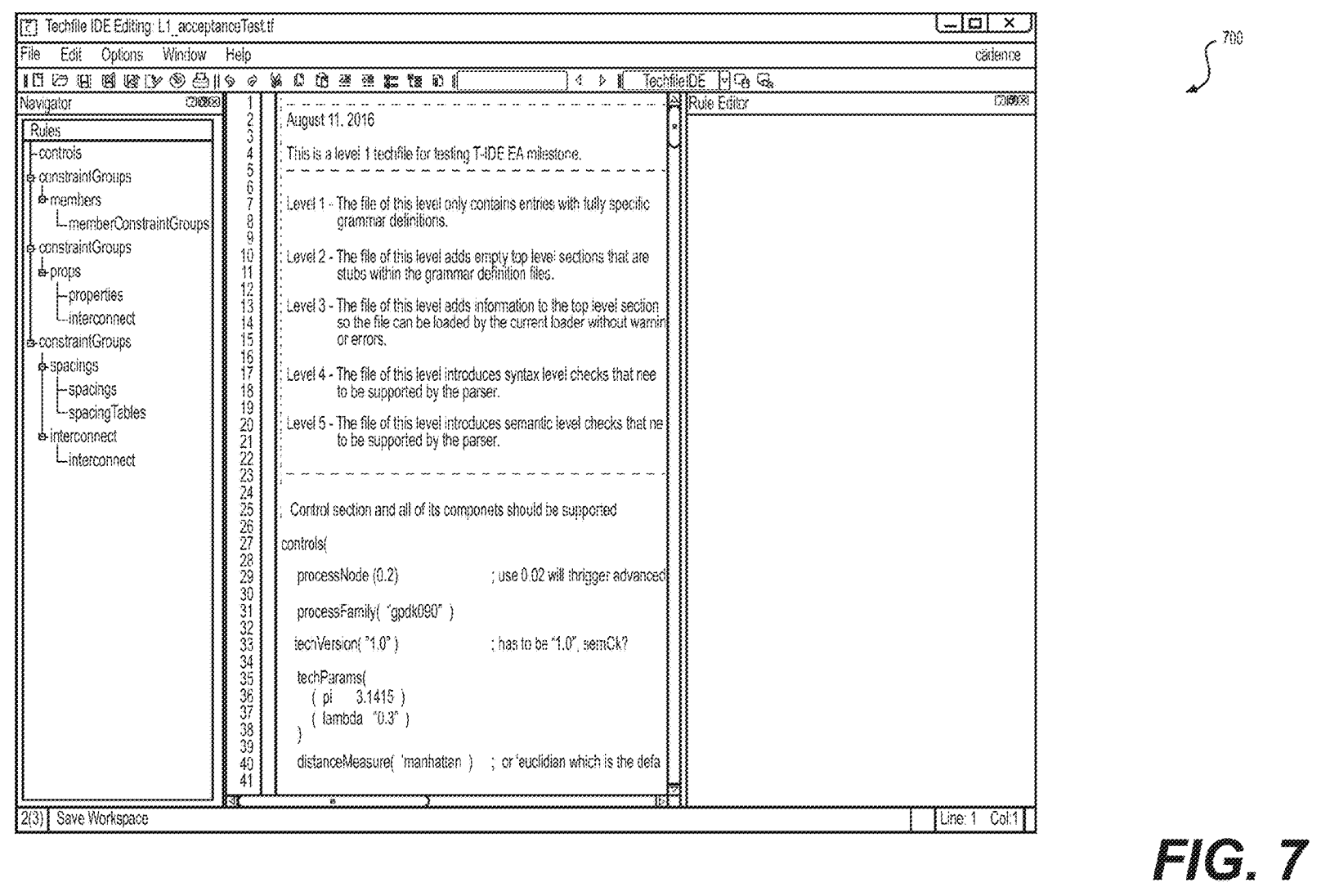

Referring now to FIG. 7, an embodiment depicting a graphical user interfaces 700 that may be used in accordance with design process 10 is provided. GUI 700 shows a technology rule file may be opened in its text editor (mid pane). In this particular embodiment, the navigator (left pane) may be configured to display an outline view of the technology rule file. The rule editor (right pane) may be empty at this time.

Figure 8:
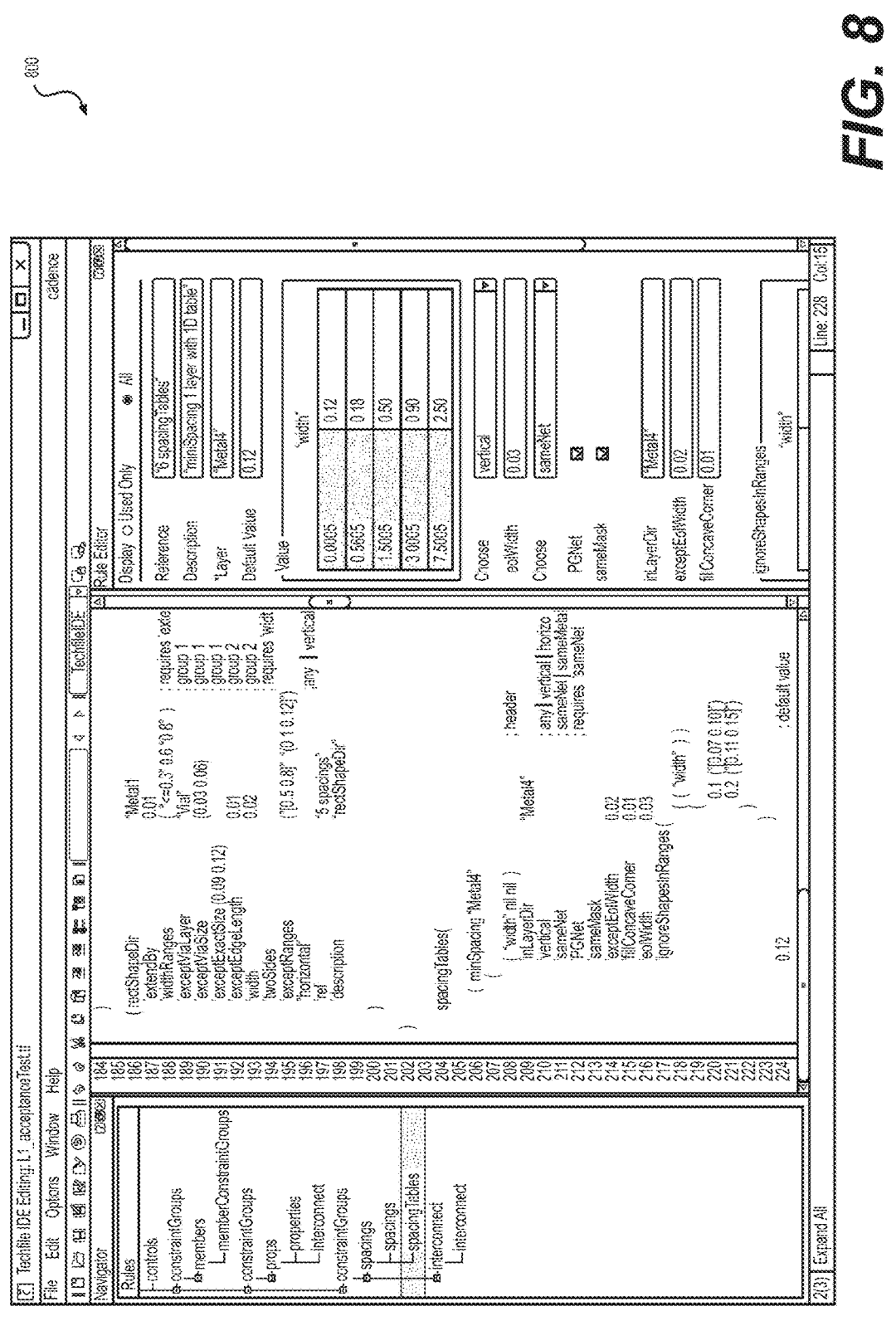

Referring now to FIG. 8, an embodiment depicting a graphical user interface 800 that may be used in accordance with design process 10 is provided. GUI 800 illustrates a user selecting on 'spacingTable' in the navigator and the corresponding text may be displayed and/or scrolled into view in the text editor (line 204).

Figure 9:
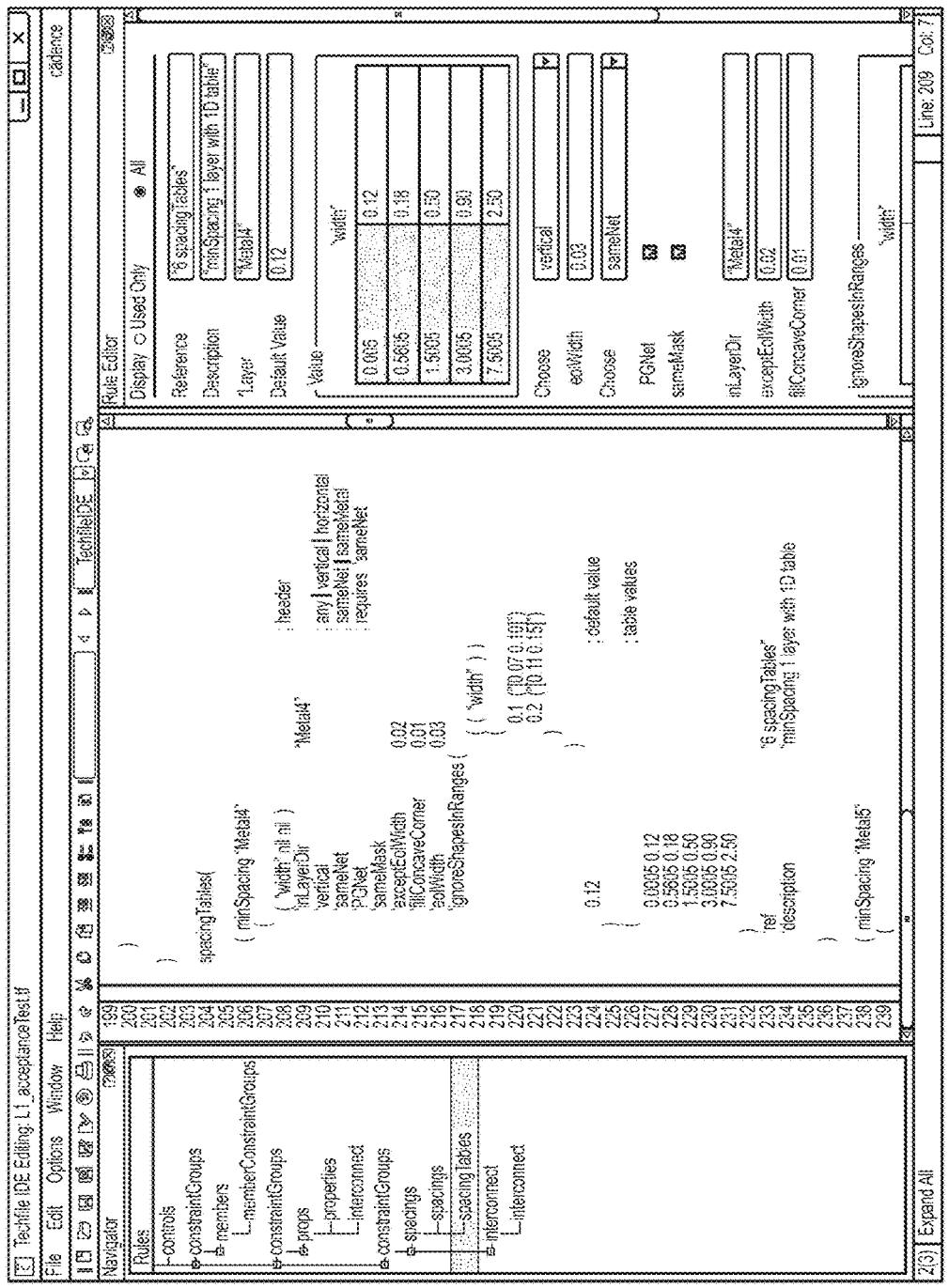
FIG. 9 is a diagram depicting aspects of the design process in accordance with an embodiment of the present disclosure.

Referring now to FIG. 9, an embodiment depicting a graphical user interface 900 that may be used in accordance with design process 10 is provided. GUI 900 illustrates a user selecting 'minSpacing' (line 206) in the text editor and the corresponding rule may be shown in the rule editor. It should be noted that lines 227 to 231 are a table value and it is shown in the GUI as a 1D table (under the label 'value').

Figure 10:
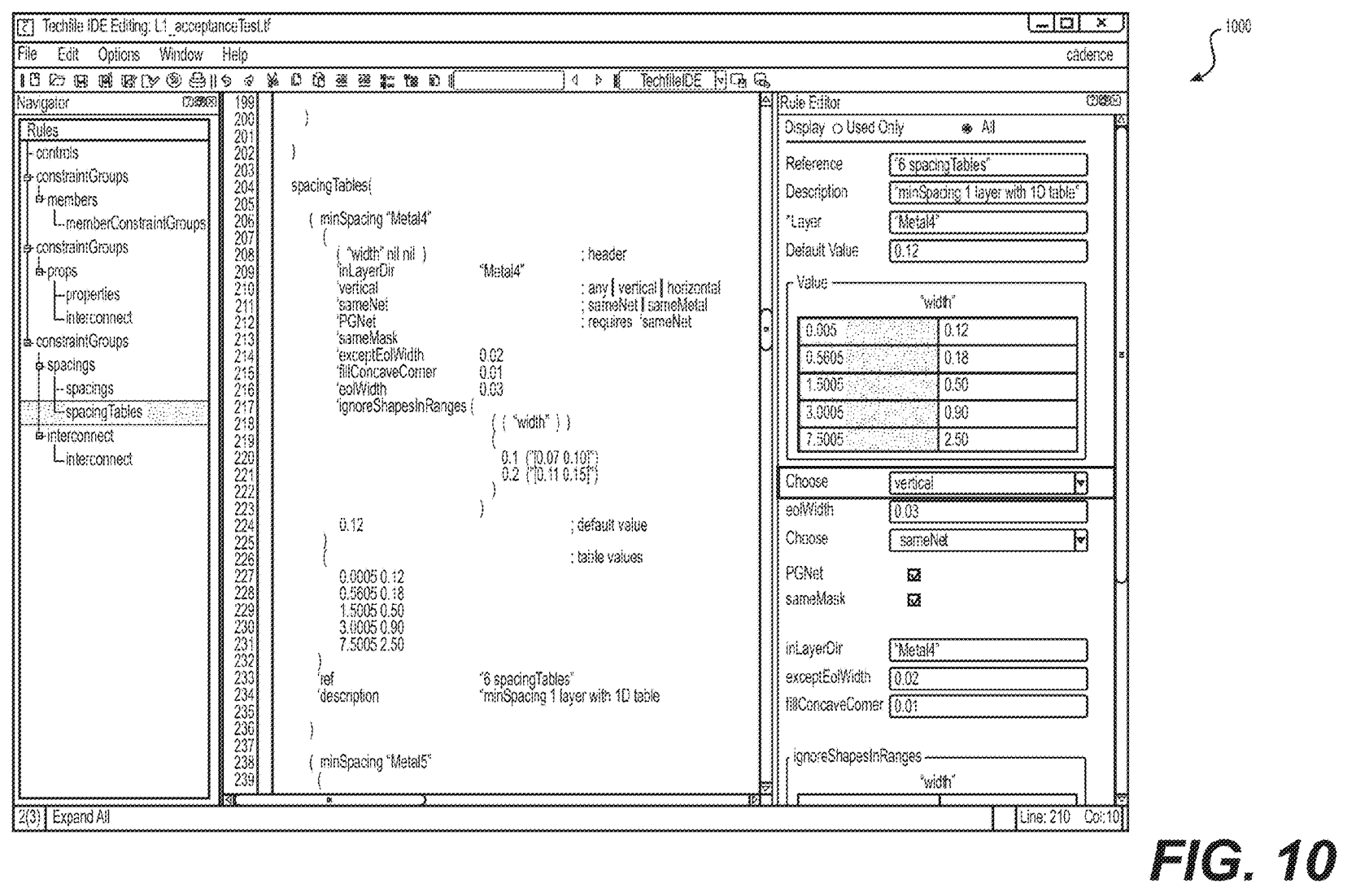

Referring now to FIG. 10, an embodiment depicting a graphical user interface 1000 that may be used in accordance with design process 10 is provided. GUI 1000 illustrates a user selecting 'vertical' (line 210) in the text editor and the corresponding widget in the rule editor is shown highlighted.

Figure 11:
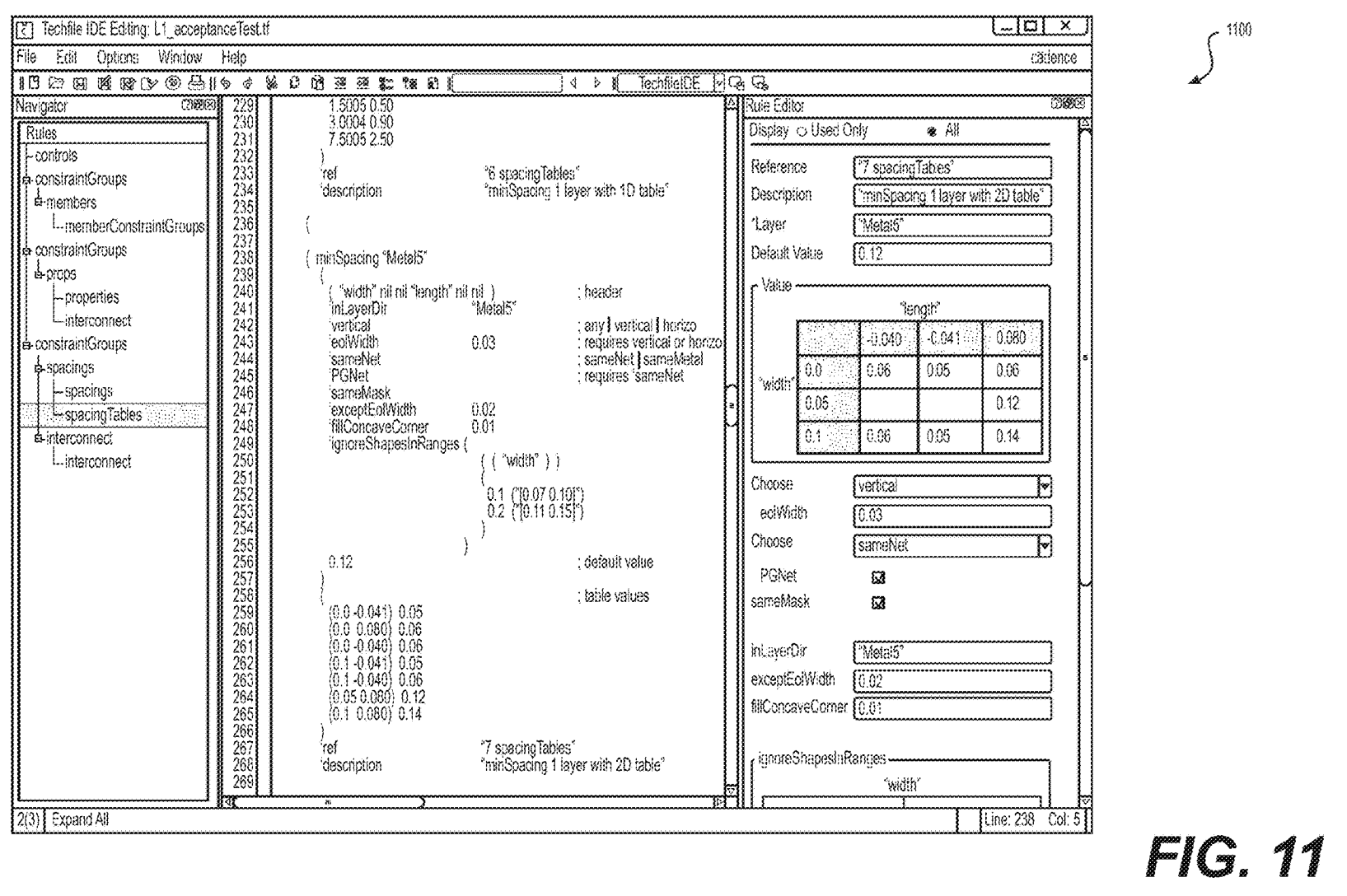

Referring now to FIG. 11, an embodiment depicting a graphical user interface 1100 that may be used in accordance with design process 10 is provided. GUI 1100 illustrates a user selecting 'minSpacing' (line 238) in the text editor and the corresponding rule may be shown in the rule editor. It should be noted that lines 259 to 265 are a table value and it is shown in the GUI as a 2D table (under the label 'value').

Figure 12:
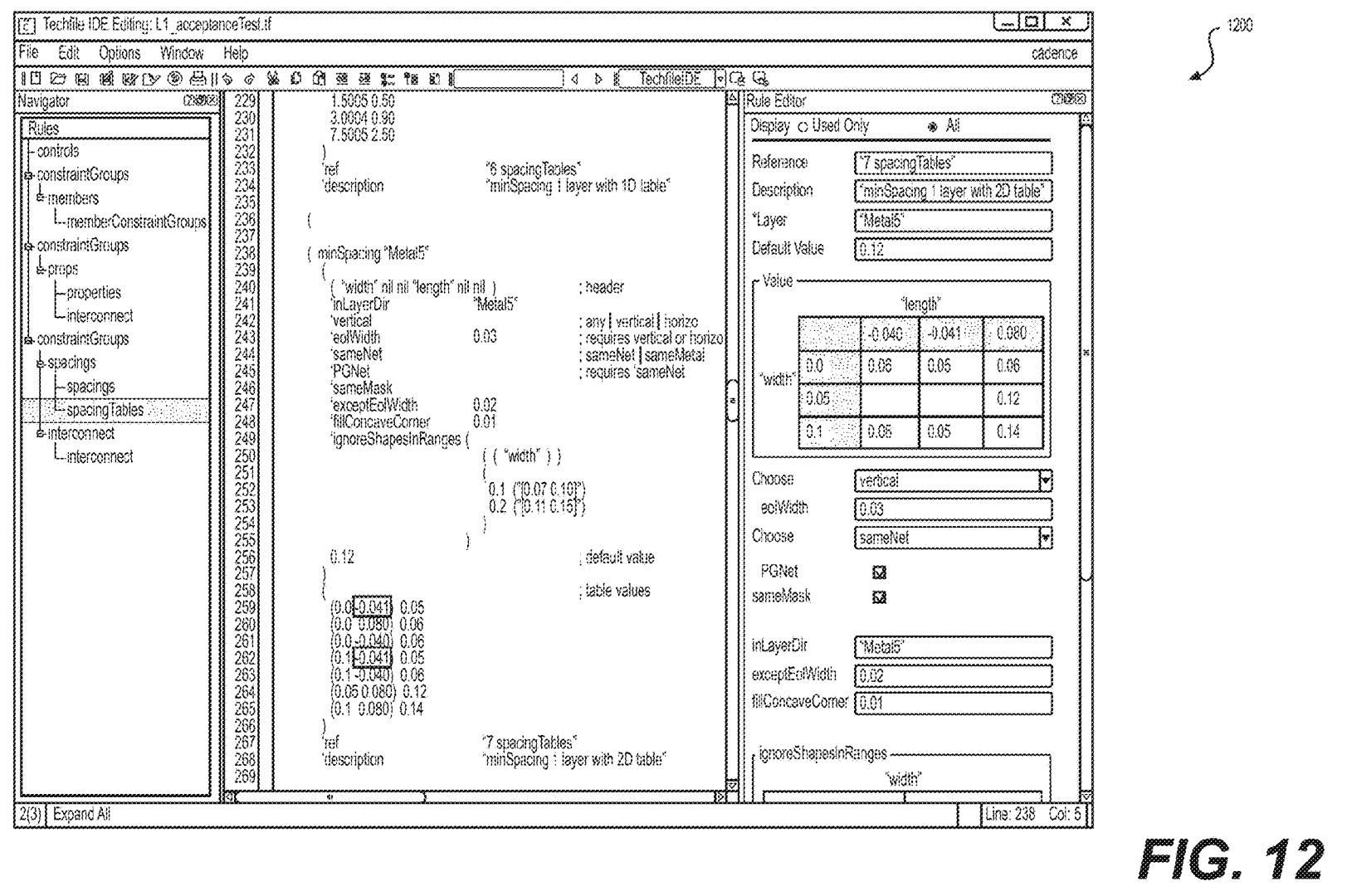

Referring now to FIG. 12, an embodiment depicting a graphical user interface 1200 that may be used in accordance with design process 10 is provided. GUI 1200 illustrates a user selecting in table cell '−0.041' in the rule editor and the corresponding text in the text editor may be highlighted.

Figure 13:
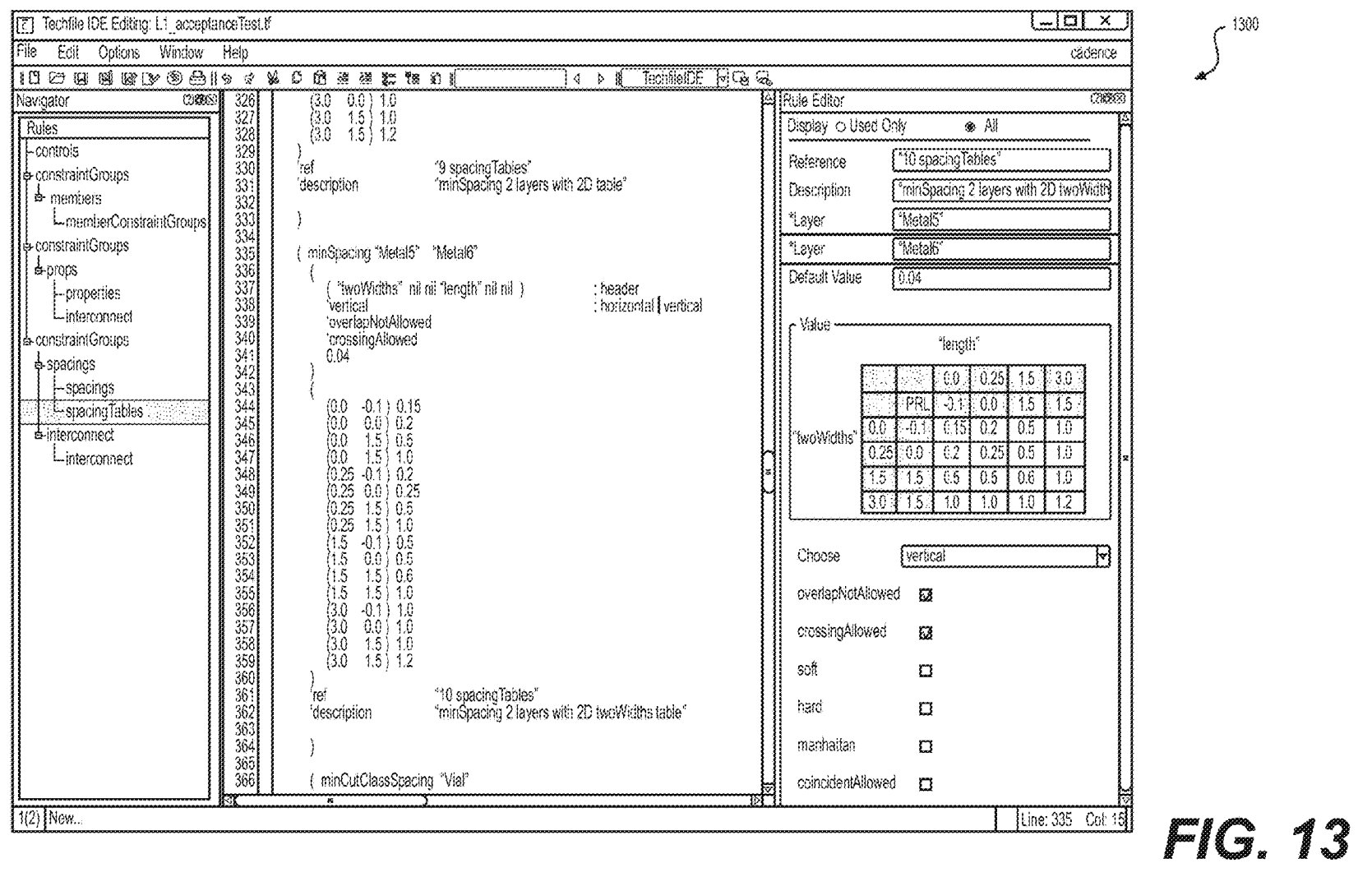

Referring now to FIG. 13, an embodiment depicting a graphical user interface 1300 that may be used in accordance with design process 10 is provided. GUI 1300 illustrates a user selecting 'minSpacing' (line 335) in the text editor and the corresponding rule may be shown in the rule editor. It should be noted that lines 344 to 359 represent an unique 2D table (under the label 'value') that may be referred to as the 'two width table'. This unique table within the GUI may be configured to guide the user on how to interpret the textual values.

Figure 14:
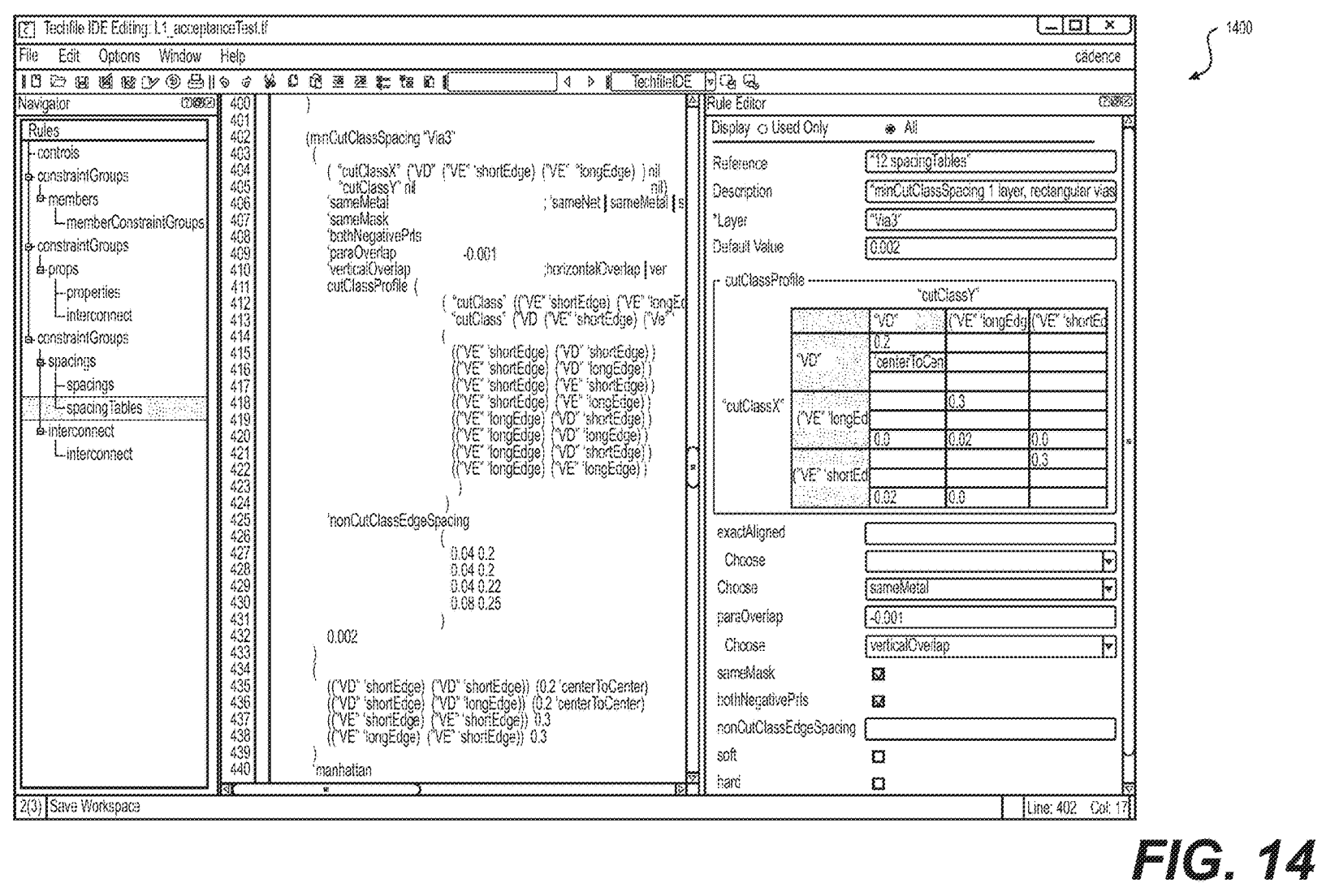

Referring now to FIG. 14, an embodiment depicting a graphical user interface 1400 that may be used in accordance with design process 10 is provided. GUI 1400 illustrates a user selecting 'minCutClassSpacing' (line 402) in the text editor and the corresponding rule that may be displayed in the rule editor. It should be noted that lines 412 to 423, and 435 to 438 represent an unique 2D table (under the red label 'cutClassProfile'). This unique table may merge two tables from the text and represent them in one two dimensional table where each table cell contains three elements. Again, this is where the GUI may guide the user on how to interpret the textual values.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:
1. A computer implemented method comprising:
defining, using at least one processor, a grammar object system including one or more of objects, elements, values and relationships;
generating a technology grammar binary representation associated with an electronic design, based upon, at least in part, the grammar object system, wherein the grammar object system is expressed as an extensible markup language ("XML") expression;

automatically generating code based upon, at least in part, the XML expression;

receiving a technology ASCII representation;

parsing both the technology grammar binary representation and the technology ASCII representation to generate a technology binary representation; and providing the technology binary representation to a graphical user interface, wherein the graphical user interface is configured to allow for the display or editing of at least one electronic design automation process technology rule.

2. The computer implemented method of claim 1, further comprising:

providing the technology binary representation to a technology rule documentation module.

3. The computer implemented method of claim 1, wherein automatically generating code includes automatically generating C++ code.

4. The computer implemented method of claim 1, wherein the graphical user interface is configured to display a dialog based upon, at least in part, a rule associated with a text editor.

5. The computer implemented method of claim 1, wherein the graphical user interface includes at least one of a text editor and a rule editor.

6. A non-transitory computer readable medium having stored thereon instructions, which when executed by a processor result in one or more operations, the operations comprising:

defining, using at least one processor, a grammar object system including one or more of objects, elements, values and relationships;

generating a technology grammar binary representation associated with an electronic design, based upon, at least in part, the grammar object system, wherein the grammar object system is expressed as an extensible markup language ("XML") expression;

automatically generating code based upon, at least in part, the XML expression;

receiving a technology ASCII representation;

parsing both the technology grammar binary representation and the technology ASCII representation to generate a technology binary representation; and providing the technology binary representation to a graphical user interface, wherein the graphical user interface is configured to allow for the display or editing of at least one electronic design automation process technology rule.

7. The non-transitory computer readable medium of claim 6, further comprising:

providing the technology binary representation to a technology rule documentation module.

8. The non-transitory computer readable medium of claim 6, wherein automatically generating code includes automatically generating C++ code.

9. The non-transitory computer readable medium of claim 6, wherein the graphical user interface is configured to display a dialog based upon, at least in part, a rule associated with a text editor.

10. The non-transitory computer readable medium of claim 6, wherein the graphical user interface includes at least one of a text editor and a rule editor.

11. A system comprising:

at least one processor configured to define a grammar object system including one or more of objects, elements, values and relationships, the at least one processor further configured to generate a technology grammar binary representation associated with an electronic design, based upon, at least in part, the grammar object system, wherein the grammar object system is expressed as an extensible markup language ("XML") expression, the at least one processor further configured to automatically generate code based upon, at least in part, the XML expression, the at least one processor configured to receive a technology ASCII representation and parse both the technology grammar binary representation and the technology ASCII representation to generate a technology binary representation, the at least one processor further configured to provide the technology binary representation to a graphical user interface, wherein the graphical user interface is configured to allow for the display or editing of at least one electronic design automation process technology rule.

12. The system of claim 11, wherein the at least one processor is further configured to provide the technology binary representation to a technology rule documentation module.

13. The system of claim 11, wherein automatically generating code includes automatically generating C++ code.

14. The system of claim 11, wherein the graphical user interface is configured to display a dialog based upon, at least in part, a rule associated with a text editor.

* * * * *